(12) United States Patent
Kim et al.

(10) Patent No.: US 7,700,429 B2
(45) Date of Patent: Apr. 20, 2010

(54) METHOD FOR FORMING FIN TRANSISTOR

(75) Inventors: Do-Hyung Kim, Kyoungki-do (KR); Dae-Young Seo, Kyoungki-do (KR); Ki-Ro Hong, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 200 days.

(21) Appl. No.: 11/479,995

(22) Filed: Jun. 29, 2006

(65) Prior Publication Data
US 2007/0155075 A1 Jul. 5, 2007

(30) Foreign Application Priority Data
Dec. 29, 2005 (KR) .................. 10-2005-0133898

(51) Int. Cl.
*H01L 21/8238* (2006.01)
(52) U.S. Cl. .............. 438/217; 257/E21.693; 257/E29.27
(58) Field of Classification Search ........... 257/347, 257/369, E21.014
See application file for complete search history.

(56) References Cited

U.S. PATENT DOCUMENTS

| 7,235,436 | B1 * | 6/2007 | Lin et al. ............... 438/154 |
| 7,309,626 | B2 * | 12/2007 | Ieong et al. ........... 438/157 |
| 7,352,034 | B2 * | 4/2008 | Booth et al. ........... 257/369 |
| 7,420,230 | B2 * | 9/2008 | Tsuchiaki .............. 257/220 |
| 2004/0150071 | A1 * | 8/2004 | Kondo et al. .......... 257/623 |
| 2006/0255375 | A1 * | 11/2006 | Dokumaci et al. ..... 257/270 |

FOREIGN PATENT DOCUMENTS

| KR | 100171072 | 10/1998 |
| KR | 1020050103815 | 11/2005 |

\* cited by examiner

*Primary Examiner*—W. David Coleman
*Assistant Examiner*—Sonya D McCall-Shepard
(74) *Attorney, Agent, or Firm*—Blakely, Sokoloff, Taylor & Zafman LLP

(57) ABSTRACT

A method for forming a fin transistor includes forming a fin active region, depositing a thin layer doped with impurities over a semiconductor substrate, and forming a channel by diffusing the impurities into the fin active region of the fin transistor. In detail of the fin transistor formation, a fin active region is formed, and a patterned pad nitride layer is formed over the fin active region. A thin layer containing boron is deposited over the fin active region and isolation regions. Boron in the thin layer is diffused into the fin active region to form a channel.

11 Claims, 7 Drawing Sheets

METHOD FOR FORMING FIN TRANSISTOR

RELATED APPLICATION

The present application is based upon and claims the benefit of priority to Korean patent application No. KR 2005-133898, filed in the Korean Patent Office on Dec. 29, 2005, the entire contents of which are incorporated herein by reference.

BACKGROUND

The present invention relates to a method for fabricating a semiconductor device, and more particularly, to a method for forming a channel of a fin transistor by implanting ions in a semiconductor device.

Due to a superior on-off characteristic as well as other characteristics including high drive current and high packing density, a fin transistor is expected to replace the typical planar transistor in a nano-scale dynamic random access memory (DRAM) cell transistor. Generally, a beamline ion implantation process has been employed to form a channel in a fin transistor.

FIG. 1 is a top view illustrating a typical fin transistor. Fin active regions 13 are formed in a substrate 11 by forming isolation regions (not shown) using fin masks 14. A reference denotation 'A' represents exposed regions after the fin masks 14 are formed.

FIGS. 2A and 2B are cross-sectional views of the fin transistor in FIG. 1 cut along a perforated line II to II', illustrating various typical methods for forming a channel of a fin transistor.

Referring to FIG. 2A, the isolation region 12 is formed in the substrate 11, and the fin active region is defined by the isolation region 12. Then, an etching process is performed to form the fin active region 13.

A beamline ion implantation process for forming a channel of the fin transistor is performed to form a channel-intended region 15A inside the fin active region 13. When forming the channel-intended region 15A by employing the beamline ion implantation process, ions are implanted thicker in an upper portion of the fin active region 13 than side portions of the fin active region 13. Due to this characteristic of the beamline ion implantation process, the channel-intended region 15A has different thicknesses in the upper and side portions of the fin active region 13.

That is, if the beamline ion implantation process is employed to implant ions in the sidewalls of the fin active region 13, it is generally difficult to obtain a uniform doping profile in a 3-dimensional channel depth of a fin transistor. Therefore, a doping method using a plasma of trifluoroborane ($BF_3$) gas has been introduced to replace the 2-dimensional ion implantation process.

Referring to FIG. 2B, the isolation region 12 is formed in the substrate 11, and the fin active region is defined by the isolation region 12. An etching process is performed to form the fin active region 13.

A plasma doping process is performed using $BF_3$ plasma to form a channel region 15B inside the fin active region 13. However, a channel doping process using the $BF_3$ plasma or fluorine may result in surface damage 'B' on a top portion of the fin active region 13. Thus, a dangling bond is generated on a surface of silicon where the channel is to be formed.

If the beamline ion implantation process is performed, it is generally difficult to form the uniform doping profile in the 3-dimentional channel depth of the fin transistor. However, it is possible to implant ions in a certain regional area through the beamline ion implantation process. If the ion implantation takes place by employing the plasma doping process, it is possible to obtain the uniform doping profile in the 3-dimentional fin active region. However, the dangling bond may result from damage to the channel boundary regions caused by the fluorine radicals, and the dangling bond may function as a trap. Thus, device characteristics may be deteriorated. Although such limitation can be reduced by employing an annealing process, the annealing process may complicate the manufacturing process.

SUMMARY OF THE INVENTION

It is, therefore, an object of the present invention to provide a method for fabricating a fin transistor, which can form a uniform doping profile without generating damage in a fin active region.

In accordance with an aspect of the present invention, there is provided a method for forming a fin transistor, including: forming a fin active region; depositing a thin layer doped with impurities over a semiconductor substrate; and forming a channel by diffusing the impurities into the fin active region of the fin transistor.

In accordance with another aspect of the present invention, there is provided a method for forming a fin transistor, including: forming a fin active region; forming a patterned pad nitride layer over the fin active region; depositing a thin layer containing boron over the fin active region and isolation regions; and diffusing boron of the thin layer into the fin active region to form a channel.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE EMBODIMENTS

A method for forming a fin transistor in accordance with exemplary embodiments of the present invention will be described in detail with reference to the accompanying drawings.

Figure 1:
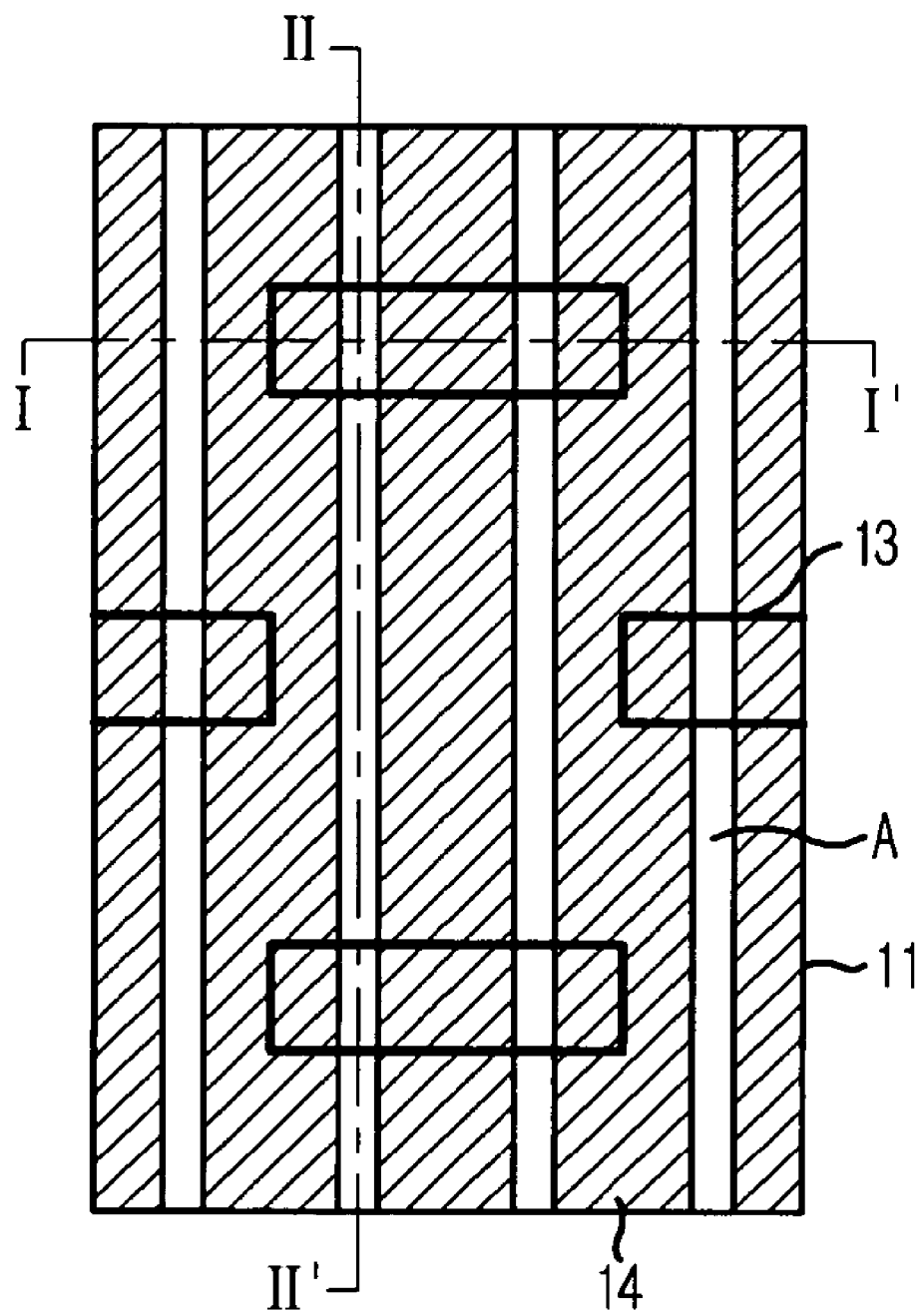
FIG. 1 is a top view illustrating a typical fin transistor.
Figure 2A:
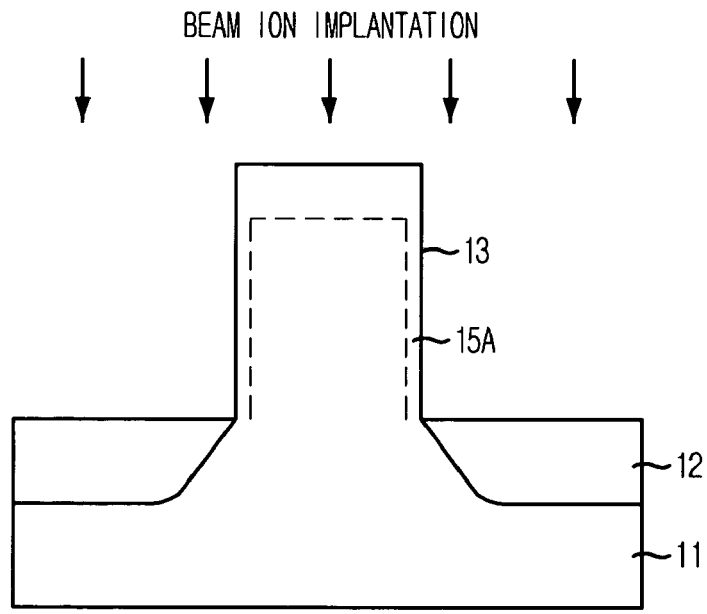
FIGS. 2A and 2B are cross-sectional views illustrating typical methods for forming a channel in a fin transistor.
Figure 2B:
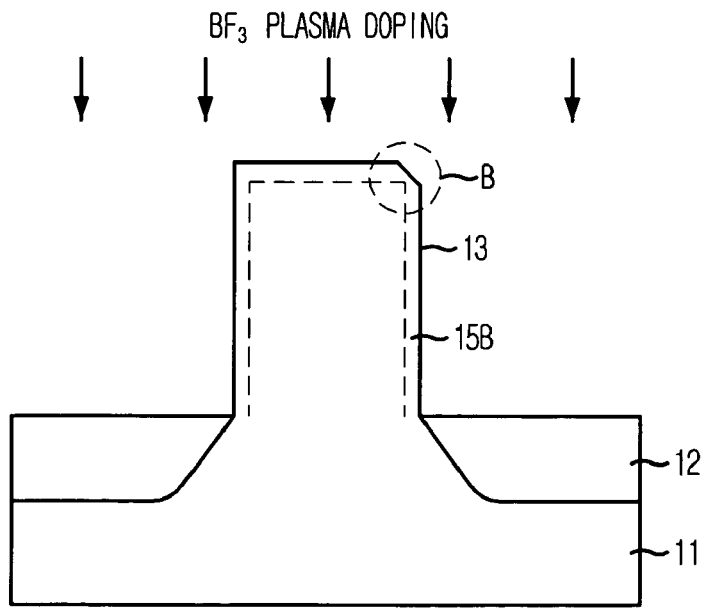
Figure 3:
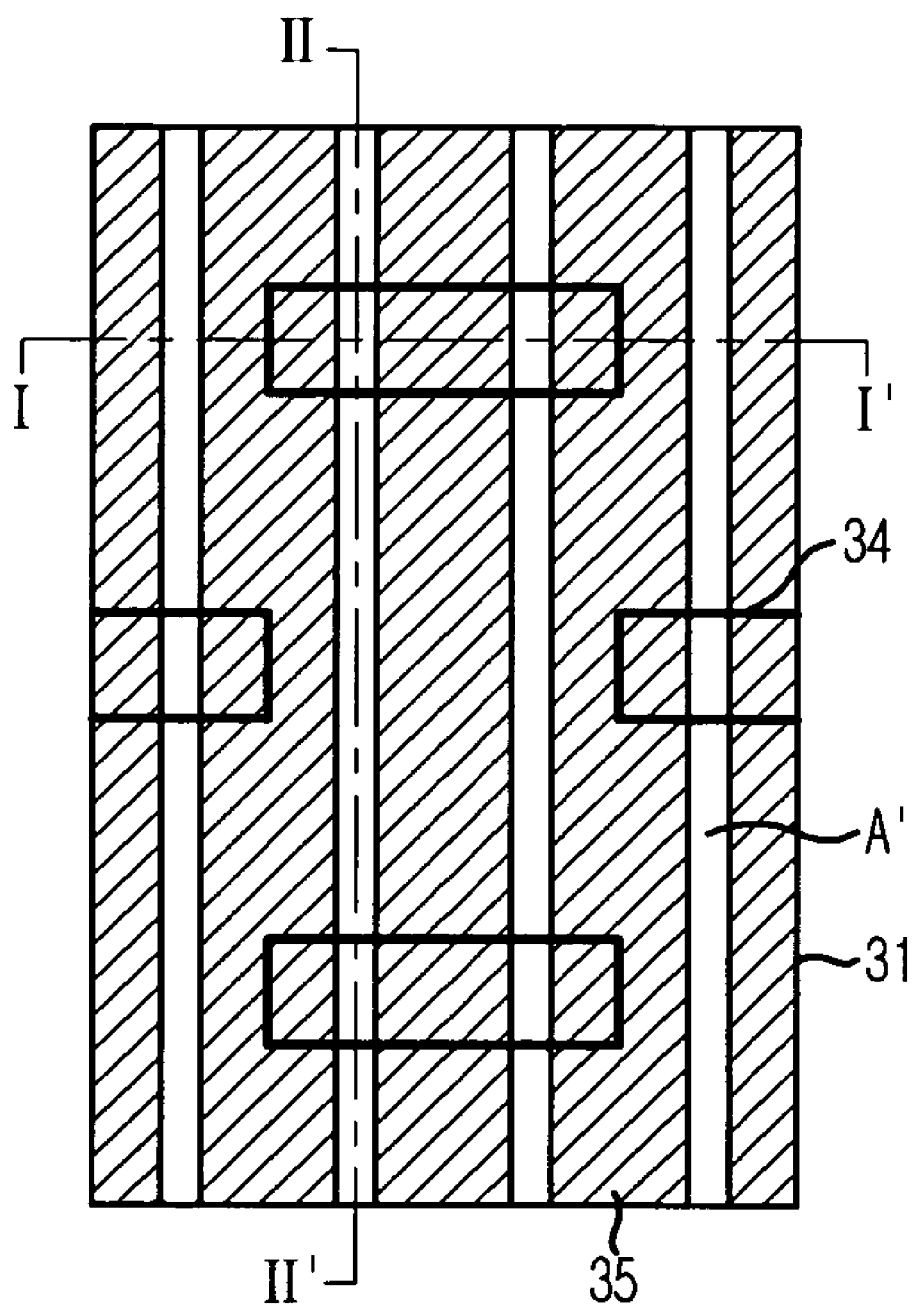
FIG. 3 is a top view illustrating a fin transistor in accordance with a specific embodiment of the present invention.

FIG. 3 is a top view illustrating a fin transistor in accordance with a specific embodiment of the present invention. Active regions 34 are formed in a substrate 31 by forming isolation regions (not shown) using fin masks 35. A reference denotation 'A'' represents exposed regions after the fin masks 35 are formed.

Figure 4A:
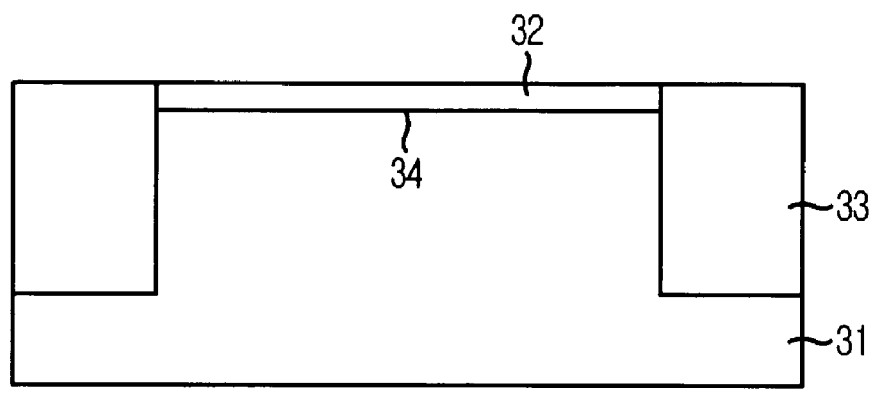
FIGS. 4A to 4D are cross-sectional views of a fin transistor cut along a line I-I' of FIG. 3 to describe a method for forming the same.
Figure 4B:
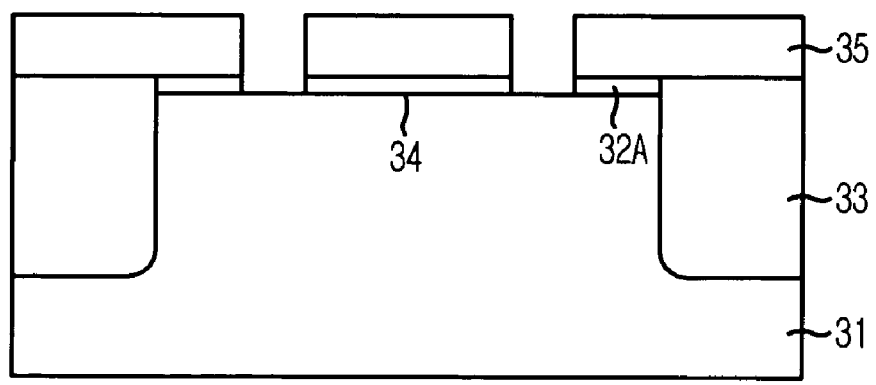
Figure 4C:
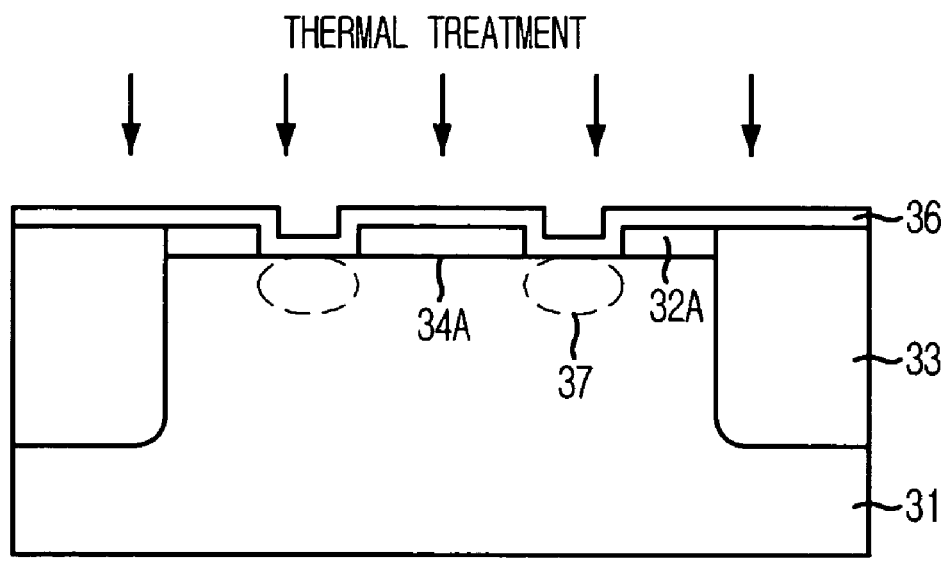
Figure 4D:
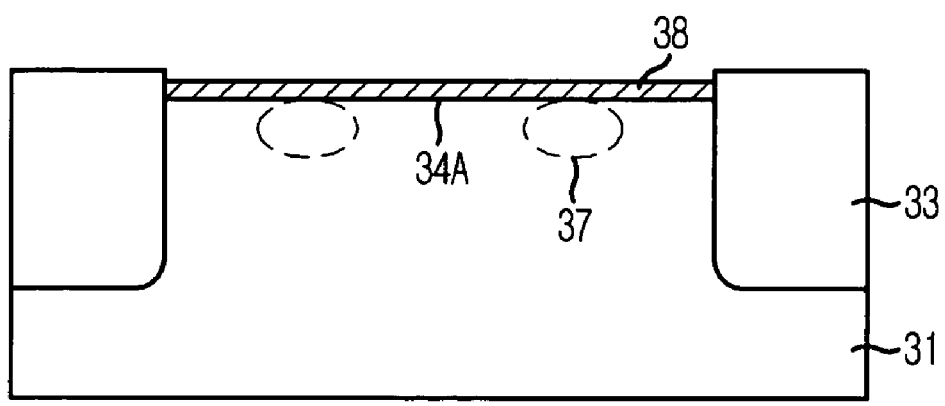
Figure 5A:
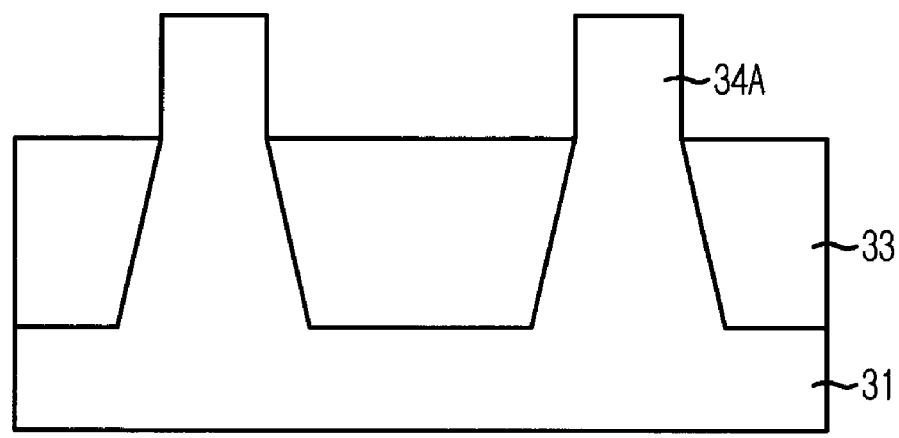
FIGS. 5A to 5C are cross-sectional views of a fin transistor cut along a line II-II' of FIG. 3 to describe a method for forming the same.
Figure 5B:
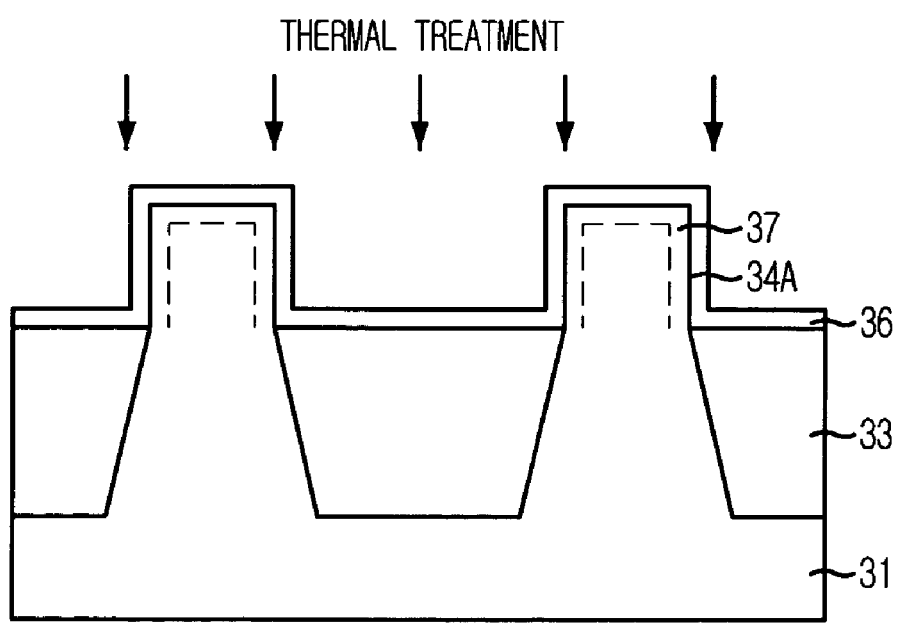
Figure 5C:
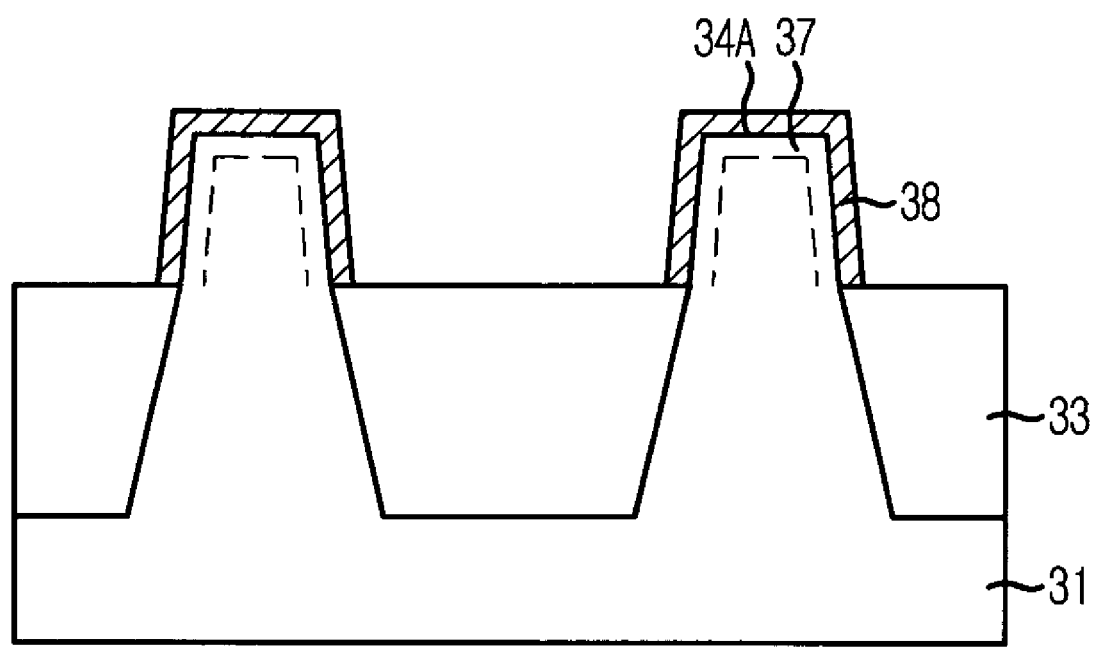

FIGS. 4A to 4D illustrate cross-sectional views of the fin transistor shown in FIG. 3 cut along a perforated line I to I', and FIGS. 5A to 5C illustrate cross-sectional views of the fin transistor shown in FIG. 3 cut along a perforated line II to II'.

Referring to FIG. 4A, a shallow trench isolation (STI) process is performed onto a substrate 31 to form an isolation region 33. An active region 34 is defined on the substrate 31 as the isolation region 33 is formed. Although not illustrated, the STI process includes sequentially forming a pad oxide layer and a pad nitride layer over the substrate 31. An isolation mask is formed over the pad nitride layer. Generally, the isolation mask includes a photoresist material.

The pad nitride layer is patterned using the isolation mask, and then, the pad oxide layer and the substrate 31 are selectively etched using the patterned pad nitride layer to form trenches. Herein, the patterned pad nitride layer is referred to as a pad nitride layer 32. After the pad nitride layer is patterned, the isolation mask is stripped away.

A gap fill insulation layer (not shown) is formed over the entire substrate structure to fill the trenches. A chemical mechanical polishing (CMP) process or an etch-back process is performed to planarize the gap fill insulation layer, targeting to expose the pad nitride layer 32. The gap fill insulation layer includes one of a layer obtained by a high density plasma (HDP) process and a layer obtained by a high aspect ratio process (HARP).

In a general isolation process, a pad oxide layer and a pad nitride layer are removed after the isolation process is performed. However, the pad nitride layer 32 remains in the present embodiment, because the pad nitride layer 32 is also used as a fin mask.

Referring to FIGS. 4B and 5A, fin masks 35 are formed to cover predetermined portions of the pad nitride layer 32 and the isolation region 33. The fin masks 35 include polysilicon. Those portions of the pad nitride layer 32 exposed between the fin masks 35 are etched using the fin masks 35 as an etch barrier to form a patterned pad nitride layer 32A, and consequently, predetermined portions of the active region 34 are exposed. The isolation region 33 is selectively etched using the fin masks 35 as an etch barrier to form protruding fin active regions 34A. A thickness of approximately 500 Å to approximately 2,000 Å of the isolation region 33 is etched away from the top surface of the active region 34.

Referring to FIGS. 4C and 5B, the fin masks 35 are removed, and a thin layer containing boron is formed over the resultant substrate structure. A borosilicate glass (BSG) layer 36 is used for the thin layer containing boron. The BSG layer 36 is formed to be used in a channel doping process for the fin transistor. A thermal treatment is performed to diffuse boron existing in the BSG layer 36 into the substrate 31, more specifically, into the protruding fin active regions 34A to form channel-intended regions 37. The thermal treatment includes one of an annealing process and a laser annealing process, and is generally performed at a temperature of approximately 1,000° C. or higher.

According to the specific embodiment of the present invention, the channel-intended regions 37 are formed by diffusing boron contained in the thin layer, and consequently, a uniformity limitation in the typical beamline ion implantation process or a generation of damage in the fin active region during the typical plasma doping process can be reduced. The specific embodiment of the present invention provides uniformity and improves channel characteristics. Furthermore, the process can be simplified because the process does not require a separate ion implantation process.

Referring to FIGS. 4D and 5C, a wet or dry etching is performed to remove the BSG layer 36 after the channel-intended regions 37 are formed. The patterned pad nitride layer 32A is removed using phosphoric acid ($H_3PO_4$). A gate insulation layer 38 is formed over the protruding fin active regions 34A. The gate insulation layer 38 is formed by employing a low plasma oxidation process to avoid an out-diffusion of boron. A low pressure oxidation process can be employed to improve rounding of top corners of the protruding fin active regions 34A. Although not illustrated, a gate electrode is formed over the gate insulation layer 38.

In accordance with the specific embodiment of the present invention, the uniform doping profile can be obtained using the BSG layer and the 3-dimensional fin channel boron diffusion by eliminating disadvantages of the typical ion implantation process and by doping only the necessary amount of ions needed in the 3-dimensional channel structure.

According to the specific embodiment of the present invention, a uniform channel without defects can be formed in a fin active region by forming a thin layer containing boron, i.e., BSG layer, over the fin active region, performing a thermal treatment, and diffusing boron into the fin active region. Thus, deterioration of channel characteristics can be reduced, and steps of forming the device can be simplified due to the elimination of an ion implantation process. Consequently, production cost can also be reduced.

While the present invention has been described with respect to certain specific embodiments, it will be apparent to those skilled in the art that various changes and modifications may be made without departing from the spirit and scope of the invention as defined in the following claims.

What is claimed is:

1. A method of forming a fin transistor, comprising:
   forming a fin active region in a substrate having isolation regions;
   forming a patterned pad nitride layer on a portion of the fin active region;
   depositing a layer containing boron on the patterned pad nitride layer, a remaining portion of the fin active region and the isolation regions; and
   diffusing boron of the layer into the remaining portion of the fin active region to form a channel.

2. The method of claim 1, further comprising:
   removing the layer that contained the boron;
   removing the patterned pad nitride layer; and
   forming a gate insulation layer and a gate electrode over the fin active region.

3. The method of claim 1, wherein the layer containing the boron includes a borosilicate glass (BSG) layer.

4. The method of claim 2, wherein the removing of the layer includes performing one of a wet etching process and a dry etching process.

5. The method of claim 2, wherein the gate insulation layer is formed by employing a low plasma oxidation process.

6. The method of claim 2, wherein the removing of the patterned pad nitride layer includes using phosphoric acid ($H_3PO_4$).

7. The method of claim 2, wherein depositing the layer containing the boron comprises depositing the layer containing the boron on a side portion of the fin active region.

8. The method of claim 3, wherein the diffusing of the boron of the layer into the remaining portion of the fin active region includes performing a thermal treatment.

9. The method of claim 5, wherein the gate insulation layer is formed by employing a low pressure oxidation process.

10. The method of claim 8, wherein the thermal treatment includes one of an annealing process and a laser annealing process.

11. The method of claim 10, wherein the thermal treatment is performed at a temperature of approximately 1,000° C. or higher.

* * * * *